(12) United States Patent
Kam (10) Patent No.: US 6,360,422 B1
(45) Date of Patent: Mar. 26, 2002

(54) METHOD OF MOUNTING A STRUCTURAL MEMBER IN A CABINET FOR SPACE CONSERVATION

(75) Inventor: Lit-Yan Kam, Wayside, NJ (US)

(73) Assignee: Lucent Technologies, Inc, Murray Hill, NJ (US)

( * ) Notice: Subject to any disclaimer, the term of this patent is extended or adjusted under 35 U.S.C. 154(b) by 0 days.

(21) Appl. No.: 09/466,633

(22) Filed: Dec. 17, 1999

Related U.S. Application Data (62) Division of application No. 09/005,454, filed on Jan. 12, 1998, now Pat. No. 6,005,195.

(51) Int. Cl.[7] .............................................. B23P 11/00
(52) U.S. Cl. ................... 29/525.11; 29/462; 29/525.01; 361/825; 248/220.22; 248/205.1; 312/111
(58) Field of Search .............................. 29/525.11, 462, 29/525.01; 361/825, 732, 735; 248/300, 201, 220.21, 220.22, 205.1; 312/111

(56) References Cited

U.S. PATENT DOCUMENTS

| 4,398,647 A | * | 8/1983 | Ackerman | ................... 220/3.9 |
| 5,921,412 A | * | 7/1999 | Merl | ....................... 211/90.03 |

FOREIGN PATENT DOCUMENTS

DE 304509 A * 7/1982

* cited by examiner

Primary Examiner—S. Thomas Hughes
Assistant Examiner—John C. Hong
(74) Attorney, Agent, or Firm—Henry I. Schanzer (57) ABSTRACT

A method of securing a mounting bracket on a wall of a structural member comprises inserting lugs of the mounting bracket through slots through a wall of the member and securing the lugs to an inside surface of the wall. The mounting bracket is used for mounting the structural member within a cabinet by sliding the member in snug fit within a cabinet, the internal securing of the lugs avoiding interference with the snug fitting relationship.

3 Claims, 7 Drawing Sheets

METHOD OF MOUNTING A STRUCTURAL MEMBER IN A CABINET FOR SPACE CONSERVATION

This is a divisional application of application Ser. No. 09/005,454, filed Jan. 12, 1998 now U.S. Pat. No. 6,055,195 on Dec. 21, 1999.

BACKGROUND OF THE INVENTION

This invention relates to equipment mounting structures, and particularly to such structures including cabinets, racks, frames and the like for removably housing circuit board packages used for telecommunications purposes.

In telecommunication networks, changes are constantly occurring, both in the subscribers connected to the network and to the services provided to the various subscribers. For accommodating rapid changes, the recent practice has been to terminate subscriber communication lines, e.g., metal wires and optical fibers, on circuit board packages removably housed within equipment shelves. The shelves, in turn, are mounted on various mounting structures, referred to as racks or frames and the like, which, in turn, can be mounted within enclosed cabinets. The circuit board packages include various electrical and/or optical components for processing signals arriving at the circuit board packages, and the mounting structures provide means for housing the circuit board packages and include cables for routing signals and electrical power to, between and from the various circuit boards. Changes in the network are readily achieved by replacing various circuit board packages or changing the signal routing therebetween.

For greatest flexibility of use, design standards have been established whereby different circuit board package receiving shelves can be interchanged with one another in the same and different mounting structures located in a common telephone control office or different central offices. A problem caused is that the design standards are often so complete and detailed that desired changes in the various components of the mounting structures, arising from experience with use of the mounting structures or in the design of replacement structures, are difficult to make within the existing standards.

The present invention addresses this problem primarily in the context of providing improved components for use in existing mounting structures or, owing to advantages provided by the new components, for use in new mounting structures made according to new standards.

SUMMARY OF THE INVENTION

In general, mounting structures for which components are provided according to the present invention comprise a frame formed from a grid of support members, spaced apart shelf-assemblies mounted on the frame for receipt of circuit board packages, and various cables more or less fixed in place for conveying signals and power throughout the frame and any cabinet in which the frame is disposed.

In accordance with this invention, a mounting method makes use of a bracket comprising an elongated metal strip including spaced apart mounting lugs projecting transversely (e.g., at right angles) from the strip. The lugs include screw threaded openings. In the mounting method, the lugs are inserted through slots in side walls of the shelf-assemblies and screwed in place against an interior surface of the side walls by means of flat-headed screws passing through counter-bored openings through the side walls. The elongated metal strips project laterally outwardly from the side walls for the securing of the shelf-assemblies to the supporting framework. The internal securing of the lugs to the side walls avoids increases in the maximum allowed widths of the shelf-assemblies.

BRIEF DESCRIPTION OF THE DRAWINGS

Some of the drawings are schematic and the various drawings are not to the same scale.

FIGS. 4–9 are figures relating to cable retaining clips wherein:

FIG. 5 shows the clip ready for use, and FIG. 6 shows optical fibers and a power cable retained by the clip.

FIGS. 10–12 are figures relating to a recessed handle for a shelf-assembly member wherein:

DESCRIPTION OF PREFERRED EMBODIMENTS

Electrical equipment mounting structures of the type which are in the present invention are known, and an example of one such structure is shown in U.S. Pat. 5,150, 277 (Sep. 22, 1992), the subject matter of which is incorporated herein by reference.

Figure 1:
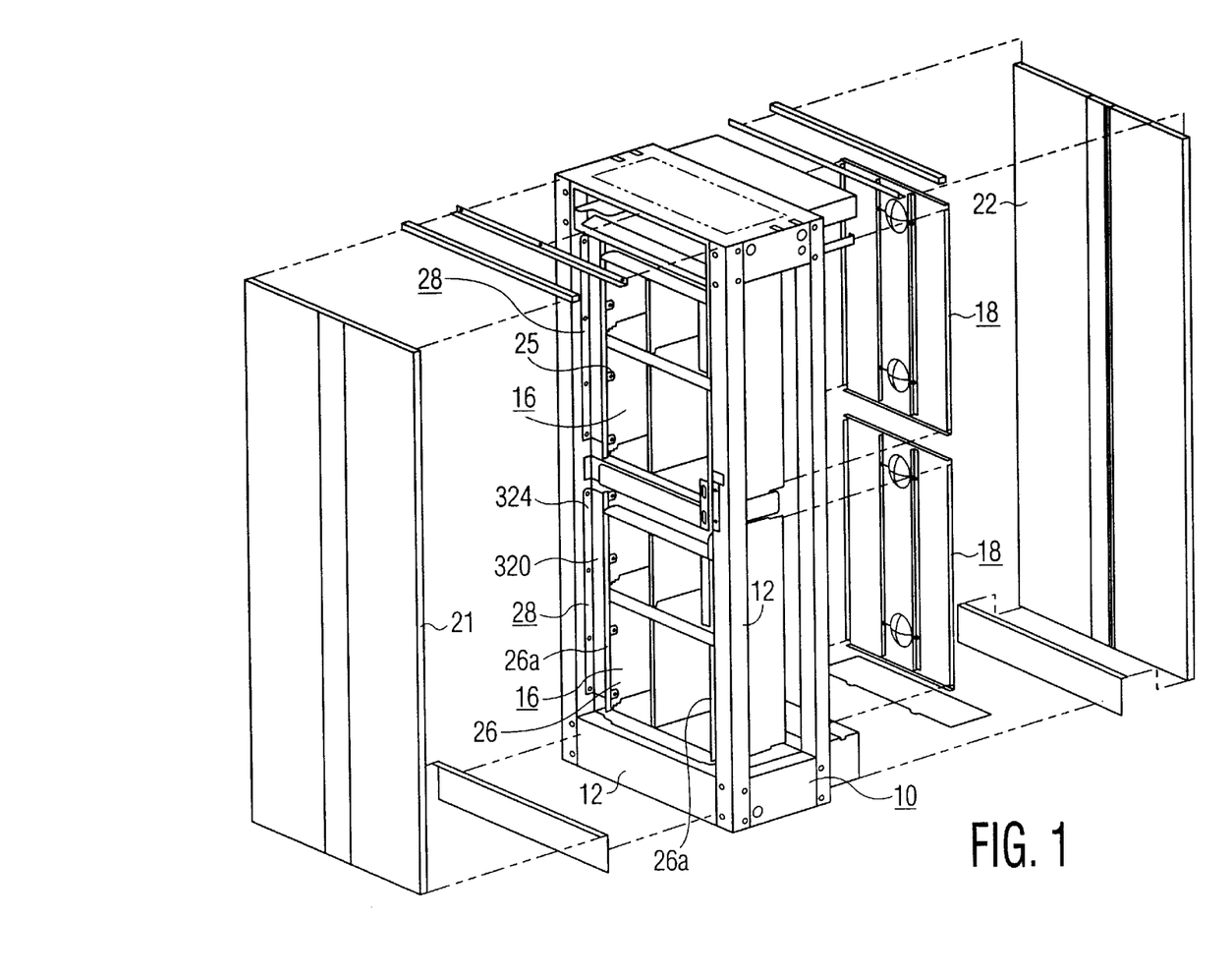
FIG. 1 is an exploded view, in perspective, of an electrical equipment mounting structure made in accordance with this invention, the structure including a rigid framework, shelf assemblies fixedly secured within the framework, and front and rear cabinet doors.

FIG. 1 herein shows an example of an electrical equipment mounting structure of known type but of a recent design taking advantage of experience gained with the use of known mounting structures and containing various structural features taking pre-existing design standards into consideration. The mounting structure includes a basic framework 10 comprising strong and rigidly secured together horizontal and vertical struts 12. Two shelf-assemblies 16 are shown mounted on the framework 10 with each shelf-assembly 16 being provided with a rear cover plate 18. The framework 10 is part of a cabinet i.e., an enclosed structure including front 21 and rear doors 22 mounted on the framework.

Figure 2:
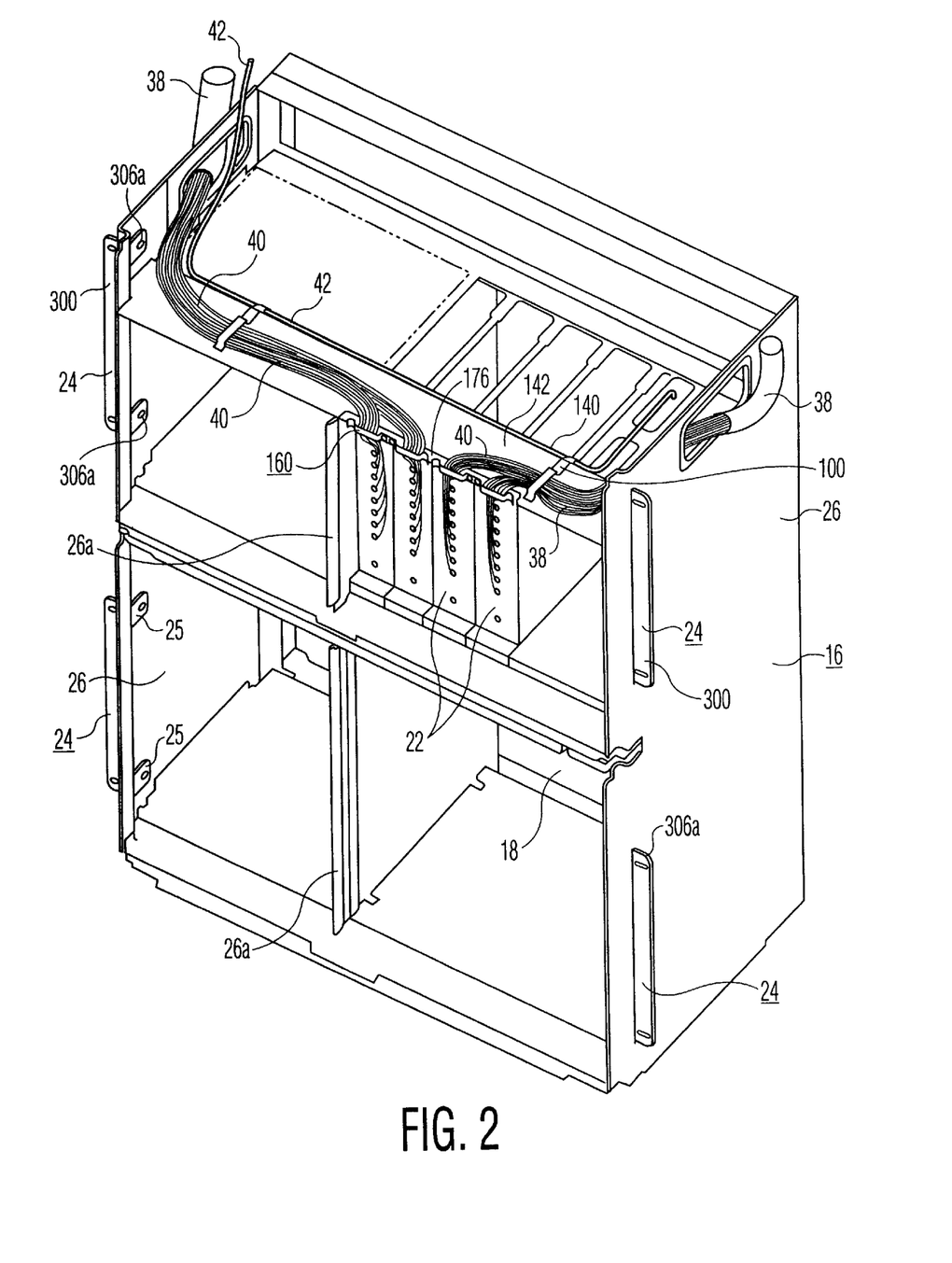
FIG. 2 is a perspective view of one of the shelf assemblies shown in FIG. 1 and showing certain structural elements in accordance with this invention.

One of the shelf-assemblies 16 shown in FIG. 1 is shown by itself in FIG. 2. Also shown in FIG. 2 are four circuit board packages 23 of known type removably received within the shelf-assembly 16.

Figure 3:
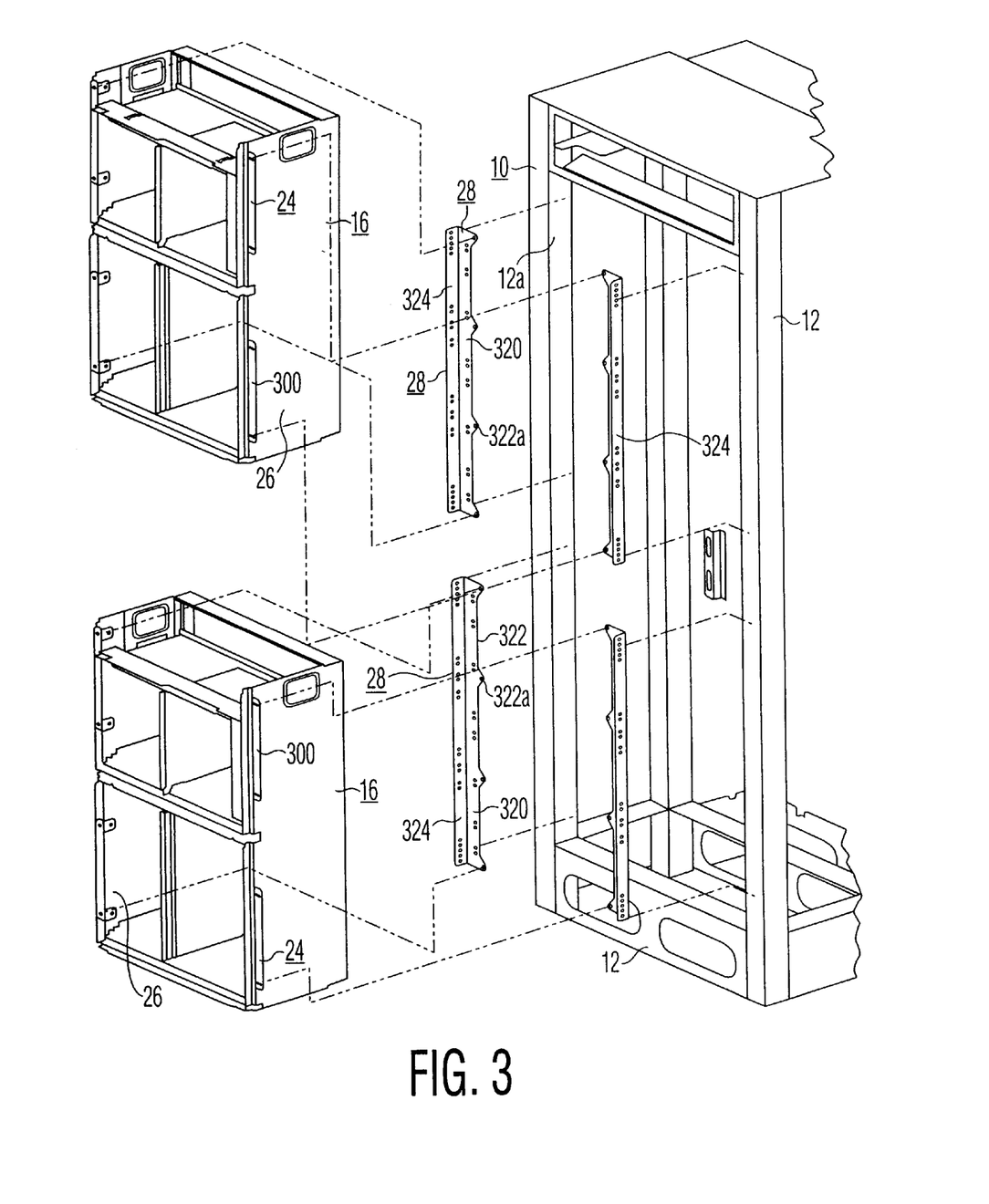
FIG. 3 is an exploded view, in perspective, of the framework shown in FIG. 1 and two shelf assemblies mounted therein.
Figure 4:
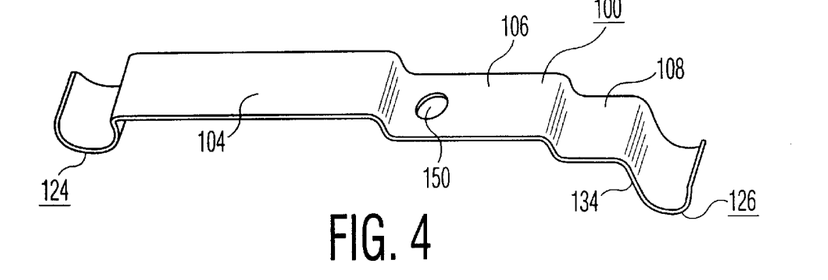
FIG. 4 is a view in perspective of one clip.
Figure 5:
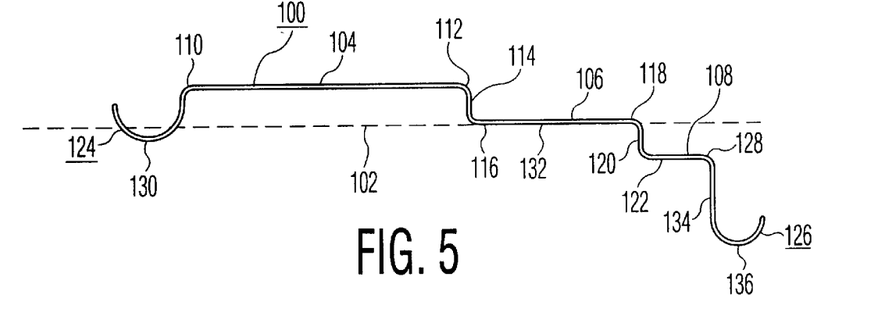
FIG. 5 is a side elevation of the clip shown in FIG. 3.

As shown in FIGS. 1 and 3, the shelf-assemblies 16 are secured to the framework 10 by mounting brackets. Pairs of cooperating brackets are used. FIG. 2 shows one bracket 24 (including lugs 25, hereinafter further described) of each of two pairs of brackets mounted on each wall 26 of each shelf-assembly 16. In FIG. 1, only the lugs 25 of the brackets 24 are visible, but FIG. 1 clearly shows the other bracket 28 of two of the bracket pairs present. How the brackets 24 and 28 are used for mounting the sub-assemblies 16 within the framework 10 is shown in FIG. 3. Further discussion of the design and use of the brackets 24 and 28 is provided hereinafter.

FIG. 2 additionally shows examples of cables typically routed within the shelf assemblies to and from circuit board packages 22 mounted thereon. Two types of cables are shown; one being cables 38 comprising a plurality of individual optic fibers 40, and the other being a power feeder 42 for conveying power to electrical and/or optical components (not shown) mounted on the circuit board packages and to power supplies (not shown) mounted within the electrical equipment cabinets.

Various improvements of structural elements used in the structures shown in FIGS. 1–3 are now described.

Clips

As mentioned, electrical and/or optical components mounted on the circuit packs are interconnected to various other components within or external to the equipment mounting structures by means of cables of electrical wires and/or optical fibers. Some of the cables are more or less permanently fixed in place whereas others of the cables must be periodically re-routed. Retainer means are used for fixing the cables in place at various locations on the mounting structures and, particularly with non-permanent cables, a need exists for a simple retaining means whereby a cable being routed can be quickly and firmly secured in place at various spaced apart positions on the mounting structure and just as simply be detached from the retaining means.

A cable retainer clip 100 satisfying these requirements is shown in FIGS. 4–7. The clip 100 is shown by itself in FIGS. 4 and 5, at several locations on the shelf assembly 16 shown in FIG. 2, and at a single location ready for use, and in use, respectively, in FIGS. 6 and 7.

The clip 100 is designed to be resiliently bent with relatively great displacements and many times without breakage or loss of strength. To this end, the clip is preferably of "spring tempered" stainless steel, e.g., of a steel commonly used in coil and leaf springs. Other materials can be used, e.g., copper alloys or plastics, and, by way of generalization, all such materials are referred to as "spring tempered" materials for indicating suitability for the function of the clip 100 shortly to be described.

The clip 100 can be mounted in any number of orientations but, for convenience of description, it is assumed to be so oriented that the terms "horizontal" and "vertical" can be used for descriptive purposes.

The clip 100 (FIGS. 4 and 5) has a generally strip-like shape, i.e., it is relatively narrow and long along an axis 102 (FIG. 5) of elongation. Other length to width shapes are possible but, as to be described, the clip functions as a leaf spring and the strip-like shape is generally preferred. With the clip axis 102 horizontally oriented, the clip can be described as including three successive steps 104, 106 and 108 with the steps succeeding one another both horizontally and vertically. Thus, a first step 104 having first and second oppositely disposed ends 110 and 112 extends horizontally with the second step end 112 connected by a first vertical plate 114 to a first end 116 of a second step 106. A second end 118 of the second step 106 is connected, in turn, by a second vertical plate 120 to a first end 122 of a third step 108.

Dependent from the first end 110 (FIG. 5) of the first step 104 is a first cam member 124, and a second cam member 126 is dependent from the second end 128 of the third step 108. Each cam member 124 and 126 is semicircular in cross-section. Of importance, but being a matter of selection dependent upon the expected use of the clip 100, is the spacing of the bottom surfaces of the cams 124 and 126 relative to the second step 106. In this embodiment, the first cam 124 is secured directly to the first end 110 of the first step 104 and is of such size that the bottom surface 130 of the first cam 124 extends (in the clip unmounted condition shown in FIGS. 4 and 5) slightly below the bottom surface 132 of the second step 106.

The second cam 126 is disposed at some distance below the third step 108 and is connected to the second end 128 thereof by a vertical plate 134. The bottom surface 136 of the second cam 126 thus extends well below the bottom surface 130 of the first cam 124.

A feature of the clip 100 is that, in a preferred use, the clip is mounted at a corner 140 (FIGS. 2 and 6) of a shelf brace member 142 and is effective for removably securing spaced apart cables against (FIG. 6) transverse upper (146) and side (144) surfaces of the member.

Figure 6:
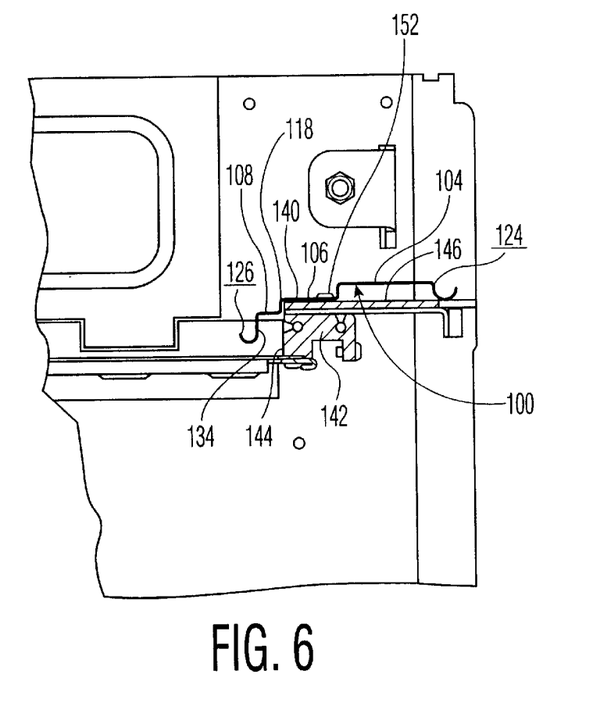
FIGS. 6 and 7 are partial sectional views of the subassembly shown in FIG. 2 showing the clip shown in FIGS. 4 and 5 mounted in place.

To this purpose, the clip second step 106 (FIG. 4) is conveniently provided with an opening 150 by means of which the clip can be firmly attached to the upper surface 146 by means of a single machine screw 152 (FIG. 6). As shown, the clip 100 is positioned adjacent to the member corner 140 such that while the second step 106 extends along the upper surface 146 of the member 142, the portion of the clip 100 from the second end 118 of the second step 106 to the second cam 126 connected to the clip third step 108 is disposed along the member side surface 144. The vertical plate 120 (FIG. 5) between the second step 106 and the third step 108 extends generally parallel to the side surface 144 of the member 142. Contact between the clip vertical plate 120 and the side surface 144 prevents rotation of the clip around the single screw 152 used to secure the clip 100 to the member 142.

As previously mentioned, the bottom surface 130 of the cam 124 extends, in the unmounted (FIG. 5) and non-flexed condition of the clip, below the bottom surface 132 of the second step 106. However, when the clip 100 is mounted on the member 142 with the upper surface 146 of the member extending parallel to the second step 106, the firm fastening of the second step 106 to the surface 146 causes a slight upward tilting of the first step 104 relative to the second step 106. FIG. 6 shows the clip 100 securely mounted on the structural member 142, but the degree of tilting of the first step 104 is so small that the first step 104 appears parallel to the surface 146. The slight tilting which does occur, i.e., a flexure of the first step 104, provides a spring force pressing the cam member 124 against the surface 146. This is discussed further hereinafter.

The location of the clip cam 126 relative to the side surface 144 of the structural member 142 is also shown in FIG. 6. In this instance, the cam 126 is spaced from the surface 144 by, essentially, the length of the third step 108.

Figure 7:
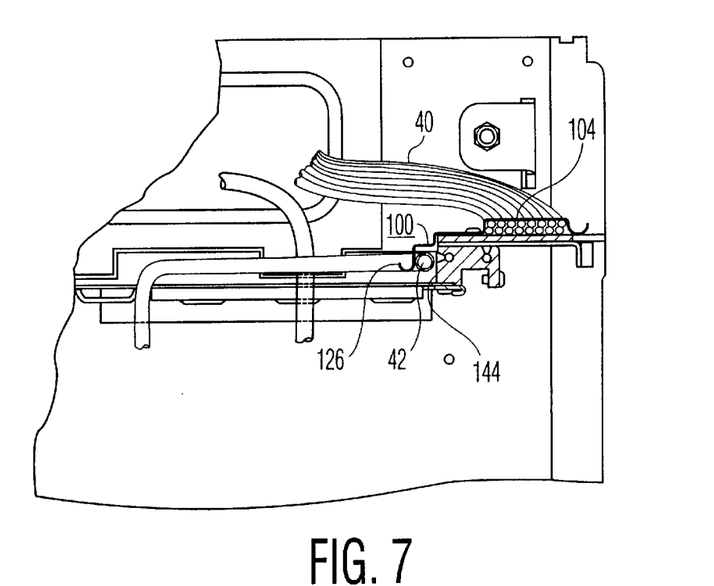

A preferred use of the clip 100 is now described. The clip 100 is first mounted on the member 142, as shown in FIG. 6, and various cables and the like are thereafter disposed between the clip 100 and the member two surfaces 144 and 146, as shown in FIG. 7. (Alternatively, but not typically, cables can be first placed against one or both member surfaces and then clamped in place as the clip is mounted in place.)

Preferably, however, with the clip fixedly in place, a plurality of relatively small diameter light guide fibers 40 (FIG. 7) are forced inwardly of the clip 100 by disposing one or more cables on the member upper surface 146 and extending perpendicular to the axis 102 of the clip 100 and urging the fiber(s), e.g., by hand, against the curved outer surface of the cam 124. The cam 124 is thus lifted above the surface 146 allowing the fiber(s) 40 to pass underneath the cam and into the space encompassed by the first step 104. The upward movement of the cam 124 further tilts and flexes the step 104 and, upon passage of the fiber inwardly of the cam 124, pressure of the flexed leaf spring clip forces the cam 124 back into contact with the member surface 146. The small optical fibers are thus retained within the clip 100. Similarly, because of the circular shape of the surface of the cam 124 facing inwardly of the clip, optical fibers otherwise securely retained within the clip can easily be removed, e.g., again by hand, by forcing the fibers laterally against the inner surface of the cam for lifting the cam for removal of the fibers.

Of importance, owing to the relatively small diameter of optical fibers, the amount of flexure of the clip necessary for the passage of the fibers beneath the cam 124 is relatively small. Accordingly, the pressure applied against the fibers is sufficiently small for avoiding damage of the fibers.

The other end of the clip containing the cam 126 serves, in this embodiment, a slightly different purpose in that, instead of retaining delicate and small diameter optical fibers, it is intended to retain a relatively large and quite rugged power cable 42. In this instance, owing to the rather large size of the cable, it is preferable that the cam 126 be spaced from the member side surface 144, as shown in FIG. 6, to provide an opening for initial receipt of the power cable partially inwardly of the clip. However, the dimensions of the clip relative to the power cable are such that a relatively large force is then required to force the cable fully inwardly of the space defined by the clip vertical plate 134, the third step 108 and the structural member surface 144. Although the cam 126 does not thereafter close the space containing the cable, the spring pressure extended by the flexed clip retains the power cable 42 in place in reliance upon friction between the typically rough surface of the power cable and the clip and structural member retaining surfaces.

While the power cable 42 is thus readily inserted into the clip space and firmly retained thereon, the cable is similarly quite easily removed from the clip.

Figure 8:
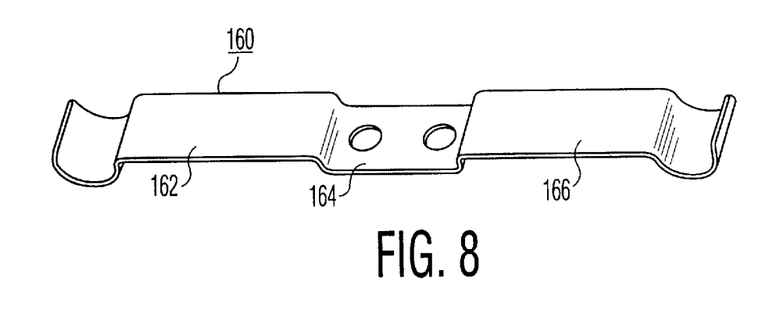
FIGS. 8 and 9 are similar to FIGS. 4 and 5, respectively, but showing another clip.
Figure 9:
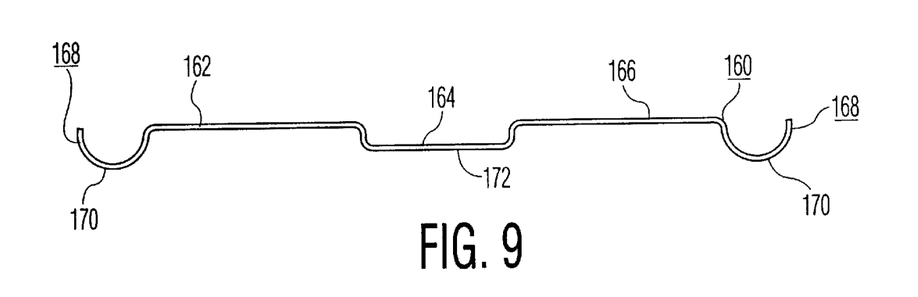

Another embodiment of a retainer clip 160 is shown in FIGS. 8 and 9. Here, three steps 162, 164 and 166 are present, but the first 162 and third 166 steps are at equal levels above (FIG. 9) the second step 164. The first 162 and third 166 steps terminate in dependent cams 168, the bottom surfaces 170 of which are spaced below the bottom surface 172 of the second step 164.

In use, as shown in FIG. 2, the second step 164 is secured to a continuous flat vertical surface 176 relative to which both clip steps 162 and 166 (FIG. 9) are slightly flexed by contact by the two cams 168 against the surface 176. Each step 162 and 166 and its attendant cam 168 functions for retaining optical fibers as previously described in connection with the cam 124 of the clip 100 (FIGS. 6 and 7).

Handle

As previously noted, in connection with the mounting structure shown in FIG. 1, separate removable shelf-assemblies 16 are included within the frame 10. Typically, the shelf-assemblies are assembled while separate from the frame and closed with rear covers 18. The covers are relatively large and awkward to handle and an improvement in the covers is that they be provided with handles on the rear facing surfaces thereof. Owing to various design standards, however, nothing can be placed on the covers which projects rearwardly of the cover rearwardly facing surface. Accordingly, quite simple but strong handles are provided recessed within the rearwardly facing surfaces of the rear covers.

Figure 10:
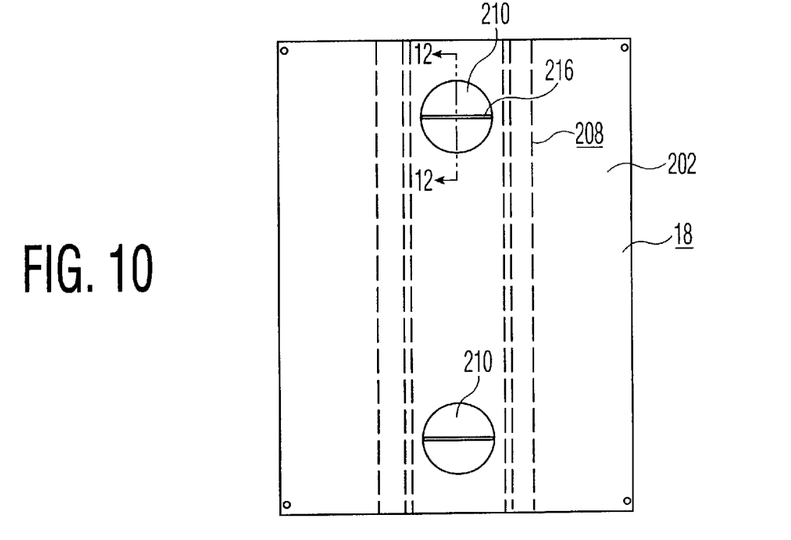
FIG. 10 is a rear elevation of a cover plate for the shelf assemblies shown in FIG. 1.
Figure 11:
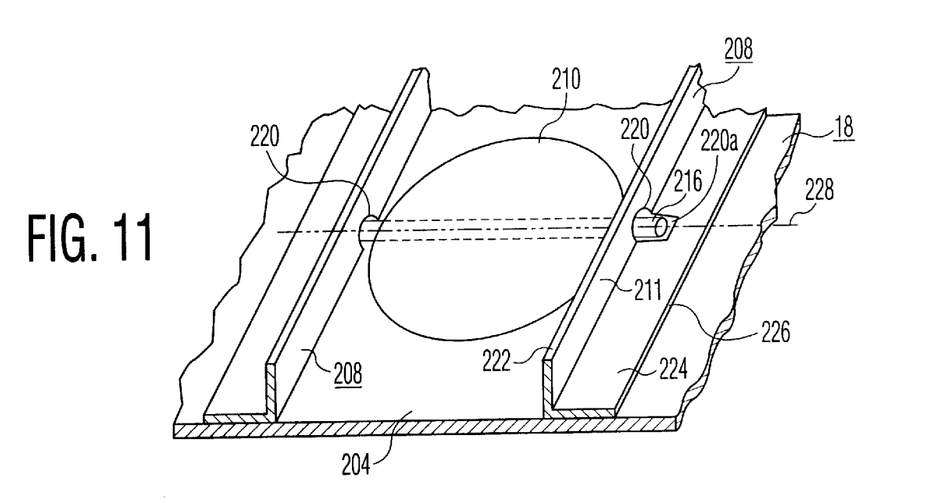
FIG. 11 is a view, in perspective, of a portion of a frontwardly facing surface of the cover plate shown in FIG. 10.
Figure 12:
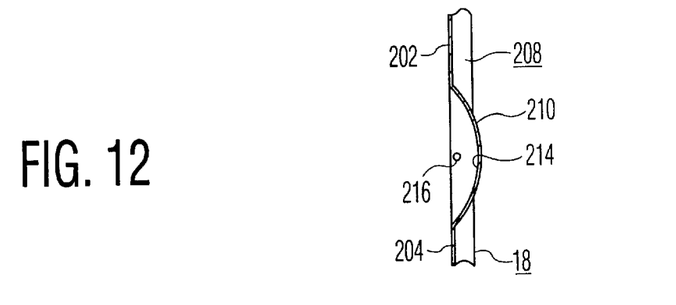
FIG. 12 is a section taken along the line 12—12 of FIG. 10.

FIG. 10 shows a typical rear cover 18 in accordance with existing design standards and including a pair of recessed handles on the rearwardly facing surface 202 of the cover 18. FIG. 10 shows the rearwardly facing surface 202, and FIGS. 11 and 12 show a portion of the opposite (frontwardly facing) surface 204 of the cover.

The cover 18 is basically a flat plate of metal having a thickness, in one typical cabinet, of 1.54 mm, a length of 715 mm and a width of 499 mm. The plate weighs around 2 kg and, because of its relatively large size, includes four right-angled stiffening braces 208, portions of two of which are shown in FIGS. 11 and 12. The braces 208 run the entire length of the cover plate (as indicated in FIG. 10), are mounted on the frontwardly facing surface 204 of the plate, and have a projecting height from the plate surface 204 of 14 mm.

For providing two recessed handles on the rear surface 202 of the cover plate, two circular depressions 210 are formed by known sheet metal forming processes, e.g., deep drawing, and comprise a portion of a sphere having a radius of 72 mm and an inside depth of 20 mm. Adding the thickness of the cover plate, the depressions 210 project about 21.5 mm inwardly of the plate rear surface 202. The depressions 210 thus have a projecting height relative to the front surface 204 of the cover plate of 18.5 mm, which is greater than the height of the braces 208. However, the amount of space provided between the inside surface of the cover and components within the shelf-assembly is adequately large to accommodate the space taken-up by the depressions.

Each depression 210 has a generally continuous spherical wall except for (FIG. 12) a pair of oppositely disposed circular holes 214 (of 5 mm diameter) entirely through the depression wall and spaced (centers of the holes) 4 mm from the rear surface 202 of the cover plate. A stainless steel rod 216, e.g., of 3.9 mm diameter, extends between and through each hole, thus spanning the depression and spaced from the depression inner bottom surface by a distance of around 17 mm and having a length, between the depression wall holes 214, of around 95 mm.

The depression and rod dimensions are selected for use of the rods 216 as hand graspable handles. The depths of the depressions 210 and the spacing of the rods 216 from the depression bottoms admit entry of a handler's fingers inwardly of the depressions and "forwardly" of the rods. Of significance, the rods 216 are fully recessed inwardly of the rear surface 202 of the cover so as not to increase the rearwardly extending dimensions of the cover. Additionally, the depressions do not weaken the cover plate and, being substantially continuous (the two rods 216 substantially filling and closing the depression wall holes 214), there is little impairment of the enclosing function of the cover 18.

For firmly securing the rods 216 in place, bores 220 (FIG. 11) are cut into the braces. Each bore 220 extends entirely through the brace vertical wall 221 and continues as a groove 220a along the surface 224 of the brace horizontal wall 226. At each depression 210, the axes 228 of the brace bores 220 on opposite sides of the depression are precisely aligned and bisect the depression. Accordingly, a handle rod 216 can be threaded along each pair of aligned bores 220 with the rod ends being snap-fitted and firmly locked in place within the brace grooves 220a.

Mounting Brackets

As shown in FIGS. 1–3, the shelf-assemblies 16 are mounted in the cabinet framework 10 by means of various mounting brackets. Of interest herein are the two previously referred to brackets 24 and 28. The brackets 24 are secured (FIG. 2) directly to side walls 26 of the shelf-assemblies 16; the brackets 28 are secured (FIG. 1) directly to the framework 10; and the brackets 24 are secured (FIG. 3) to the brackets 28 for securing the shelf assemblies to the framework 10. Preferably, all the various securings are by means of standard nuts and screws.

Figure 13:
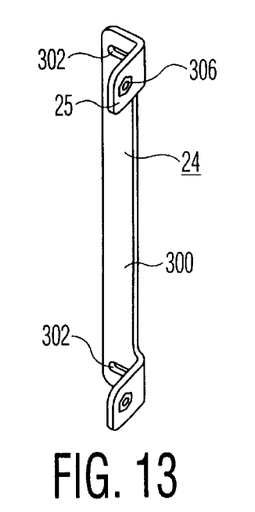
FIGS. 13 and 14 are perspective views of two shelf-assembly mounting brackets shown in FIGS. 1–3.

A bracket 24 is shown by itself, in perspective, in FIG. 13. The bracket 24 comprises an elongated strip 300 of metal having two screw receiving holes 302 therethrough, and a pair of (the aforementioned) mounting lugs 25 disposed at opposite ends of the strip 300 and extending at right angles to the strip. Each lug 25 has a hole 306 therethrough including an internal screw thread. Most simply, a threaded nut (also identified by numeral 306) is secured in place, as being press fitted into a circular opening through the lug.

The bracket 24 is secured to a shelf-assembly 16 as shown most clearly in FIG. 2. The bracket lugs 25 are passed through slots (not visible) in the side walls 26 of the assemblies and are secured to the inside surfaces of the walls 26 by means of flat-headed screws 306a passing through counter-bored screw openings through the side walls 26. The screws 306a are tightly screwed into the nuts 306 mounted on the bracket lugs 25. In FIG. 2, the shanks of four screws 306a are visible on the inside surface of the left-hand side wall 26 of the assembly.

Figure 14:
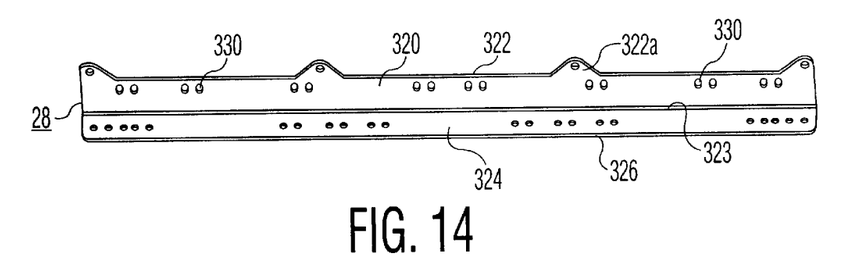

When the brackets 24 are so screwed in place, the elongated strips 300 of the brackets project laterally away from the assembly side walls 26 and can be screwed (FIG. 3) to the brackets 28 secured to the framework 10. One bracket 28 is shown, in perspective, by itself in FIG. 14. The bracket 28 is a right-angled metal member including a first elongated strip 320 having a "peaked" side edge 322 joined, along a common edge 323, to a second elongated strip 324 having a straight edge 326. By "peaked" is meant that spaced along otherwise straight portions of the edge 322 are a number of spaced apart projections 322a. The purpose of the spaced apart projections is described hereinafter. The projections 322a are quite rigid and strong extensions of the strip 320 which, in effect, has a greater width at the locations of the projections 322a than at the locations at the gaps between the projections.

As mentioned, the right angle brackets 28 are mounted on the framework 10. This is shown in FIG. 3 where the bracket 28 straight edged second strips 324 are shown to be secured to inwardly facing surfaces 12a of vertical struts 12 of the framework. The bracket 28 elongated strips 320 are also clearly visible in FIG. 1 except that the projections 322a (FIG. 14) on the brackets 28 are hidden by the front edges 26a of the shelf-assembly side walls 26. Also hidden in FIG. 1 are the elongated strips 300 (FIG. 13) of the brackets 24 secured directly to the shelf-assembly side walls 26. (In FIG. 1, the lugs 25 of the brackets 24 are visible).

As previously mentioned, portions of the mounting structure shown in FIG. 1 are different from previously made structures but are so designed that, for example, the shelf-assemblies 16 can be used in the earlier made mounting structures. In such use, the design standards are such that, except for a very narrow portion of the front end of the shelf-assembly side walls 26, nothing can be mounted on the side walls 26 which increases, to the smallest extent, the width of the shelf-assemblies. The design of the brackets 24 takes this restriction into account. Thus, the lugs 25 of the brackets 24 are not screwed to external surfaces of the walls 26, but extend through the aforementioned slots through the walls. The flat-headed screws 306a, used for securing the lugs 25 to the walls 26, are either completely recessed inwardly of the exterior surfaces of the walls 26 or, at worst, flush therewith. Thus, except for the laterally extending strips 300 of the brackets 24, which are disposed forwardly of the framework of the previously made mounting structures, the mounting of the brackets 24 on the shelf assembly side walls 26 in no way increases the width of the shelf-assemblies.

A feature of the brackets 28 is that they are multi-functional for use, in different orientations, in different mounting structures. As shown in FIGS. 1 and 3, for example, the straight edge strip 324 of the brackets 28 is secured to a strut 12 of the framework 10, and the projections 322a are secured to the elongated strips 300 of the brackets 24 secured to the shelf-assemblies 16. In this application, the full width of the peaked strip 322 of the bracket is used.

Figure 15:
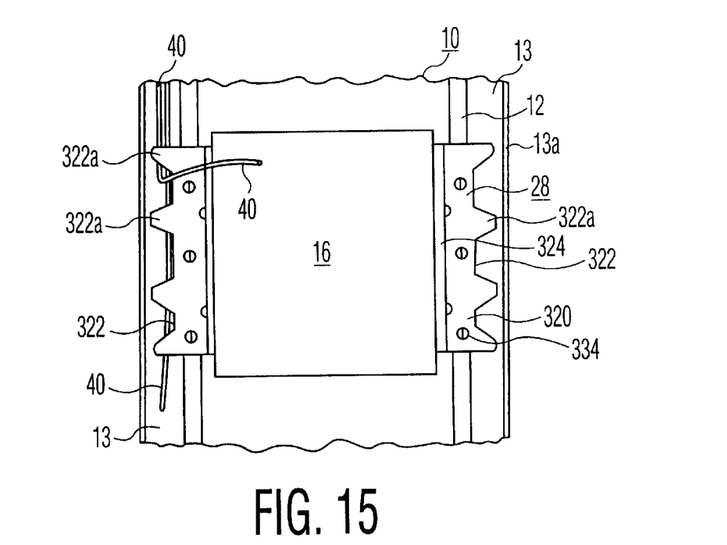
FIG. 15 is a front view of a shelf-assembly mounted within a framework of a mounting structure different from the one shown in FIGS. 1–3 and showing the use of the bracket shown in FIG. 14 in an orientation different from the orientation of the bracket as shown in FIGS. 1 and 3.

In another application, as shown in FIG. 15, the orientation of the bracket 28 is changed such that the bracket straight edged strip 324 is secured directly to a shelf-assembly and the peaked strip 320 secured directly to a strut 12 of a framework 10a. In this application, the full width of the bracket peaked strip 320 is not used, but rather the bracket strip 320 is secured to the strut by means of screws 334 passing through openings 330 (FIG. 14) through the bracket strip 320 inwardly of the strip edge 322 and spaced from the projections 322a. The projections 322a thus project beyond the strut 12 and into spaces on respective sides of the struts 12. Therein lies a problem. As indicated in FIG. 15, a vertically extended channel 13 beyond each strut 12 (e.g., between it and a forwardly projecting side wall 13a of the mounting structure shown) is used for the passage of various cables 40 some of which exit the space for routing forwardly around the struts for extension to the shelf-assembly 16. For preventing blocking of the exits for the cables by the unused (in this application) width of the bracket, gaps are provided between the projections 322a along the bracket edge 322. Thus, while the projections 322a can be provided on the bracket 28 for providing it with the necessary dimensions for the application shown in FIGS. 1–3, the gaps between the otherwise unused projections 322a of the brackets 28 permit use of the brackets 28 in the FIG. 15 application. Provided the gaps between the projections 322a are wide and deep enough to permit passage of exiting cables between adjacent projections 322a, and provided the projections 322a are adequately strong for their mounting (FIGS. 1–3) function, the projections 322*a* can have other shapes than the preferred shapes shown.

What is claimed is:

1. A method of securing a structural member having a pair of spaced apart side walls to a support structure of an electrical mounting structure, said structural member having front and back ends and being mounted within said support structure in such snug fit that the exterior surfaces of said side walls, starting from a point adjacent to said front end, are in substantially surface to surface contact with surfaces of said support structure, the method comprising:

inserting lugs of a mounting bracket through slots through one of said side walls and securing said lugs to an inside surface of said one side wall at a position rearwardly of said point, said lugs being extensions of a metal plate disposed exteriorly of said one side wall; and securing said metal plate to said support structure at a position forwardly of said point.

2. A method of securing a structural member having a pair of spaced apart side walls to a support structure of an electrical mounting structure, the method comprising:

inserting lugs of a first mounting bracket through slots through one of said side walls and securing said lugs to an inside surface of said one side wall, said lugs being extensions of a first metal plate disposed exteriorly of said one side wall and extending laterally away therefrom and terminating in a first edge;

securing spaced apart portions of said first metal plate adjacent to said first edge to corresponding spaced apart projections from a second edge of a second metal plate extending transversely of a third metal plate of a second mounting bracket; and securing said third metal plate to said support structure.

3. A method according to claim 2 wherein said support structure includes a vertical strut extending parallel to and spaced apart from said one side wall of said structural member when said structural member is secured to said support structure, the method comprising securing said third metal plate of said second bracket to a surface of said vertical strut facing towards said one side wall such that the secured together first and second plates of said first and second mounting brackets span the space between said strut and said one side wall.

* * * * *